United States Patent
Alberth, Jr. et al.

(10) Patent No.: US 9,048,524 B2
(45) Date of Patent: Jun. 2, 2015

(54) METHOD AND APPARATUS FOR COMPENSATING FOR PHASE SHIFT IN A COMMUNICATION DEVICE

(75) Inventors: William P. Alberth, Jr., Prairie Grove, IL (US); Gregory R. Black, Vernon Hills, IL (US); Daniel J. Declerck, Lake Barrington, IL (US); Armin W. Klomsdorf, Chicago, IL (US)

(73) Assignee: Google Technology Holdings LLC, Mountain View, CA (US)

( * ) Notice: Subject to any disclaimer, the term of this patent is extended or adjusted under 35 U.S.C. 154(b) by 145 days.

(21) Appl. No.: 13/565,096

(22) Filed: Aug. 2, 2012

(65) Prior Publication Data

US 2014/0038662 A1    Feb. 6, 2014

(51) Int. Cl.
| | |
|---|---|
| H04W 88/02 | (2009.01) |
| H04B 1/40 | (2006.01) |
| H04B 1/38 | (2006.01) |
| H01P 1/18 | (2006.01) |
| H04B 1/04 | (2006.01) |
| H04B 1/18 | (2006.01) |
| H03H 7/20 | (2006.01) |
| H03H 7/40 | (2006.01) |
| H01Q 1/24 | (2006.01) |

(52) U.S. Cl.
CPC .... *H01P 1/18* (2013.01); *H01Q 1/241* (2013.01); *H04B 1/0458* (2013.01); *H04B 1/18* (2013.01); *H03H 7/20* (2013.01); *H03H 7/40* (2013.01)

(58) Field of Classification Search
CPC .. G08B 13/2471; H04B 1/525; H04B 7/0848; H04B 1/0458; H04B 1/44; H04H 20/89; H04L 5/14
See application file for complete search history.

(56) References Cited

U.S. PATENT DOCUMENTS

| | | | |
|---|---|---|---|
| 7,486,941 B2 | 2/2009 | Rahman et al. | |
| 7,973,725 B2 * | 7/2011 | Qi et al. | 343/702 |
| 8,068,798 B2 | 11/2011 | Wilcox et al. | |
| 8,310,401 B2 * | 11/2012 | Qi et al. | 343/702 |
| 8,320,850 B1 | 11/2012 | Khlat | |
| 8,462,057 B2 * | 6/2013 | Qi et al. | 343/702 |
| 8,503,689 B2 * | 8/2013 | Schreuder et al. | 381/74 |

(Continued)

FOREIGN PATENT DOCUMENTS

| | | |
|---|---|---|
| EP | 1298810 A2 | 4/2003 |
| JP | 2003318689 A | 11/2003 |

(Continued)

OTHER PUBLICATIONS

Patent Cooperation Treaty, International Search Report and Written Opinion of the International Searching Authority for International Application No. PCT/US2013/051922, Oct. 30, 2013, 13 pages.

(Continued)

*Primary Examiner* — Bobbak Safaipour
(74) *Attorney, Agent, or Firm* — Faegre Baker Daniels LLP

(57) ABSTRACT

Various embodiments of methods and apparatus' for compensating for a phase shift on a communication device are described herein. In an embodiment, an antenna of a communication device is tuned based on a characteristic of the communication device, thereby causing a phase shift of a signal that is to be transmitted via the antenna. A property of the signal at the antenna after the phase shift is measured. The phase shift is compensated for based on the measured property.

20 Claims, 14 Drawing Sheets

(56) References Cited

U.S. PATENT DOCUMENTS

| | | | |
|---|---|---|---|
| 8,599,077 B2* | 12/2013 | Qi et al. | 343/702 |
| 8,706,053 B2* | 4/2014 | Camp et al. | 455/77 |
| 2002/0114444 A1 | 8/2002 | Anderson et al. | |
| 2004/0127178 A1 | 7/2004 | Kuffner | |
| 2005/0245204 A1 | 11/2005 | Vance | |
| 2007/0142014 A1 | 6/2007 | Wilcox | |
| 2008/0280570 A1 | 11/2008 | Blin | |
| 2010/0073103 A1 | 3/2010 | Spears et al. | |
| 2010/0127945 A1 | 5/2010 | Rousu et al. | |
| 2010/0197261 A1 | 8/2010 | Zibrik et al. | |
| 2010/0273441 A1 | 10/2010 | Dubash et al. | |
| 2012/0063368 A1 | 3/2012 | Boyle | |
| 2013/0069737 A1 | 3/2013 | See et al. | |
| 2013/0122829 A1* | 5/2013 | Hyvonen et al. | 455/77 |
| 2013/0251010 A1* | 9/2013 | Alberth et al. | 375/222 |
| 2013/0315285 A1* | 11/2013 | Black et al. | 375/219 |

FOREIGN PATENT DOCUMENTS

| | | |
|---|---|---|
| WO | 2006107841 A2 | 10/2006 |
| WO | 2011148225 A1 | 12/2011 |

OTHER PUBLICATIONS

International Bureau of WIPO, International Preliminary Report on Patentability for International Application No. PCT/US2013/031143 (Oct. 9, 2014).

Patent Cooperation Treaty, International Search Report for International Patent Application No. PCT/US2013/040237 (Jul. 9, 2013).

Patent Cooperation Treaty, International Search Report and Written Opinion of the International Searching Authority for International Patent Application No. PCT/US2013/031143 (Aug. 1, 2013).

* cited by examiner

METHOD AND APPARATUS FOR COMPENSATING FOR PHASE SHIFT IN A COMMUNICATION DEVICE

CROSS REFERENCE TO RELATED APPLICATIONS

The present application is related to U.S. patent application Ser. No. 13/478,811 filed on May 23, 2012, entitled "METHOD AND APPARATUS FOR COMPENSATING FOR PHASE SHIFT IN A COMMUNICATION DEVICE," by Black, et al. The present application is also related to U.S. patent application Ser. No. 13/429,886 filed on Mar. 26, 2012, entitled "METHOD AND APPARATUS FOR COMPENSATING FOR PHASE SHIFT IN A COMMUNICATION DEVICE," by Black, et al.

TECHNICAL FIELD

The present invention relates generally to antenna tuning and, more particularly, to compensating for phase shifts that result from antenna tuning.

BACKGROUND

As mobile communication has become increasingly sophisticated, antenna tuning techniques have become more advanced. Antenna tuning involves matching the impedance of the load of the components connected to an antenna to the impedance of the antenna itself. The antenna impedance may be affected by the state of the communication device (e.g., cell phone), which can be based on a variety of factors, including the position of the communication device with respect to the user's body. When the impedance of the antenna changes, it is desirable to tune the antenna (e.g. by changing the impedance of the load) in order to keep the impedances as closely matched as possible. However, when the impedance of the load changes, the phase of the signals travelling to and from the antenna also tends to change. Unfortunately, phase changes in mobile communication signals are interpreted as meaningful data, which can degrade the reception of the signal and lead to garbled transmissions. There are certain scenarios in which impedance changes and the associated phase changes can be anticipated and tolerated by the communication system. One example is when the channel being used for communication changes. During a channel change, the transmit modulator and receive modulator generally perform a channel estimate, which is used to set up the channel for use by the communication device. Should the phase change occur before the channel estimate, or occur while the transmitter is not emitting a signal, then the phase change will have no affect on the signal received at the base station. Subsequent insertion phase changes of the channel such as those due receiver mobility and multipath channel fading are also tolerated by the receiver. However, when abrupt changes in impedance occur during the transmission of data (from antenna impedance tuning, for example), it is much more difficult for the base station receiver to react to the resulting phase shift and the quality of the received signal could be degraded.

BRIEF DESCRIPTION OF THE DRAWINGS

Various embodiments of the present invention will be described below in more detail, with reference to the accompanying drawings.

It is to be noted, however, that the appended drawings illustrate embodiments of this invention and are therefore not to be considered limiting of its scope, for the invention may admit to other equally effective embodiments.

DETAILED DESCRIPTION

In accordance with various embodiments of the invention, methods and apparatus' for compensating for a phase shift on a communication device are described herein. In an embodiment, an antenna of a communication device is tuned based on a characteristic of the communication device, thereby causing a phase shift of a signal that is to be transmitted via the antenna. A property of the signal at the antenna after the phase shift is measured. The phase shift is compensated for based on the measured property. Possible characteristics on which the antenna tuning is based include the band, sub-band or channel on which the communication device is communicating; the application for which the communication device is being used (e.g. right hand talking, left hand talking, or balanced); the state of the antenna (delivered power, reflected power of the antenna, return loss, and impedance); and the state of a transmission modulator and a receive demodulator of the communication device (transmission modulator receive demodulator favored, or balanced).

Figure 1A:
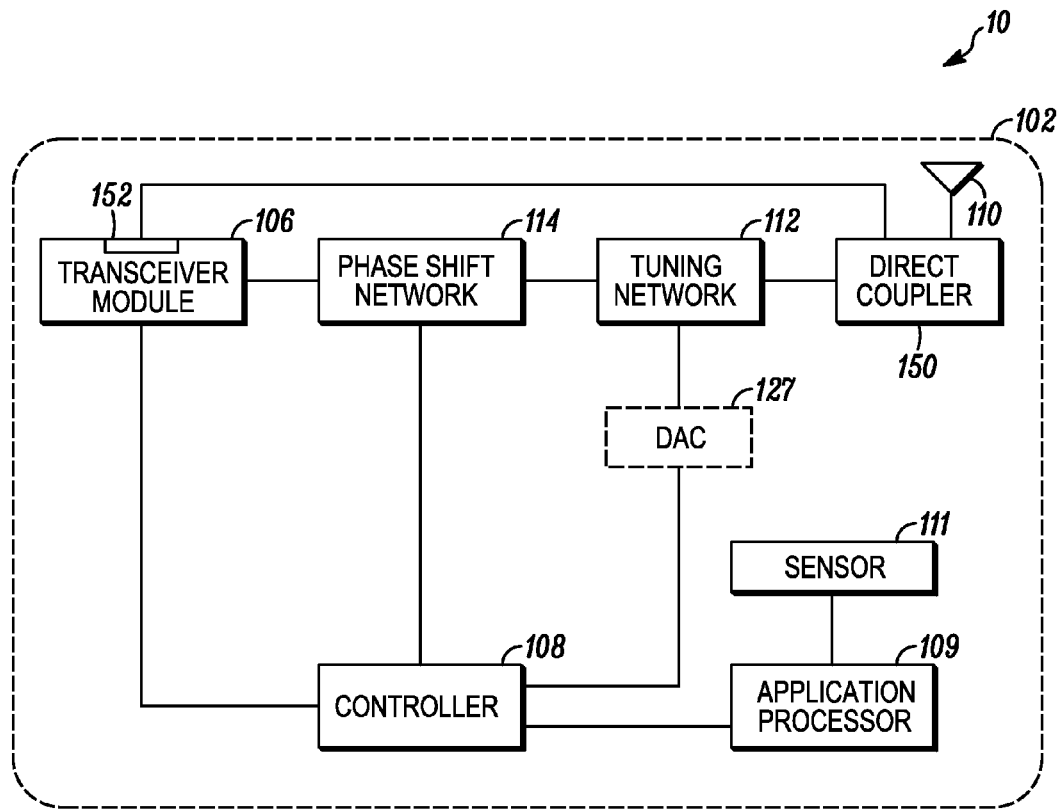
FIGS. 1A and 1B are examples of a communication system in which the invention may be implemented.
Figure 1A:
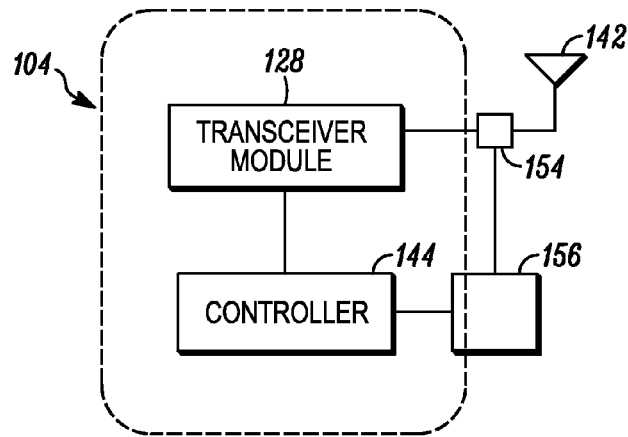

An example of a communication system in which the invention may be implemented will now be described. Referring to FIG. 1A, the communication system, generally labeled 10, includes a communication device 102 and a base station 104. The communication device 102 may be any of a variety of devices, including a cell phone (smartphone or otherwise), a dongle, a notebook computer, user equipment (UE), or tablet computer. Similarly, the base station 104 may be any of a variety of devices, including a base station of a cellular network, a wireless access point, or a mobile device acting as a wireless access point. In one embodiment, the communication device 102 is a 4G Long-Term Evolution (LTE) mobile device and the base station 104 is a base station of a 4G LTE network. The communication device 102 includes an antenna 110, a direct coupler 150 coupled to the antenna 110, a variable tuning network 112 electrically coupled to the direct coupler 150, a tunable phase shift network 114 electrically coupled to the tuning network, and a transceiver module 106 electrically coupled to the phase shift network 114.

The communication device 102 also includes a controller 108 communicatively linked to the transceiver module 106, the phase shift network 114 and the tuning network 112. The communication device 102 further includes an application processor 109 communicatively linked to the controller 108 as well as to other components of the communication device 102, such as to a sensor 111. The sensor 111 (e.g., a proximity sensor) detects conditions that are being experienced by the communication device 102, such as the physical position of the communication device 102. For example, the sensor 111 can detect antenna states and conditions that affect antenna performance. The controller 108 operates the tuning network 112 to change the impedance of the tuning network 112 so that its impedance more closely matches the impedance of the antenna 110 than prior to the change. In one embodiment, the default impedance of the transceiver module 106 is about 50 ohms, and the impedance of the antenna 110 is a complex impedance other than 50 ohms. To carry out tuning in one embodiment, the controller 108 operates the tuning network 112 to change its input impedance to 50 ohms and operates the tuning network 112 to change its output impedance to the complex conjugate of the antenna impedance, which is the impedance needed to maximize the transfer of power into and out of the antenna 110. Thus, the tuning network 112 transforms the antenna impedance to 50 ohms, thereby 'matching' the impedance of transceiver 106 with that of the antenna 110. As will be discussed below in more detail, the phase shift network 114 compensates for changes in phase that can occur due to changes in the tuning network 112.

Referring still to FIG. 1A, the transceiver module 106 converts data streams to radio frequency (RF) signals and vice-versa to facilitate the transmission and receipt of communication by the communication device 102. During transmission, RF signals from the transceiver module 106 pass through the phase shift network 114, tuning network 112, the direct coupler 150, and are transmitted via the antenna 110. The application processor 109 executes application programs to control various functions of the communication device 102, such as displaying pictures and text on a display, facilitating voice calls, setting up data connections, etc. The controller 108 controls the operation of the transceiver module 106, the phase shift network 114 and the tuning network 112.

The direct coupler 150 receives a signal from the tuning network 112, and passes an equivalent signal to a measurement module 152 (located in the transceiver module 106). The measurement module 152 is communicatively linked to the controller 108. The measurement module 152 measures properties of the signal, such as its phase shift, amplitude or return loss of the signal. The measurement module 152 transmits the data regarding the signal properties to the controller 108. In some embodiments, there is no measurement module 152 and the direct coupler 150 passes a signal to the transceiver module 106 (specifically the receive demodulator, as will be described in more detail below).

The base station 104 includes a transceiver module 128 and a controller 144 communicatively linked to the transceiver module 128. The base station further includes an antenna 142, which is electrically coupled to the transceiver module 128. The transceiver module 128 converts data streams into RF signals and vice-versa to facilitate communication by the base station 104. The controller 144 controls the operation of the transceiver module 128.

In an embodiment of the invention, the base station 102 further includes a direct coupler 154 electrically coupled to the transceiver module 128 and to the antenna 142, as well as a measurement module 156, whose functions are similar to their counterparts in the communication device 102.

Figure 1B:
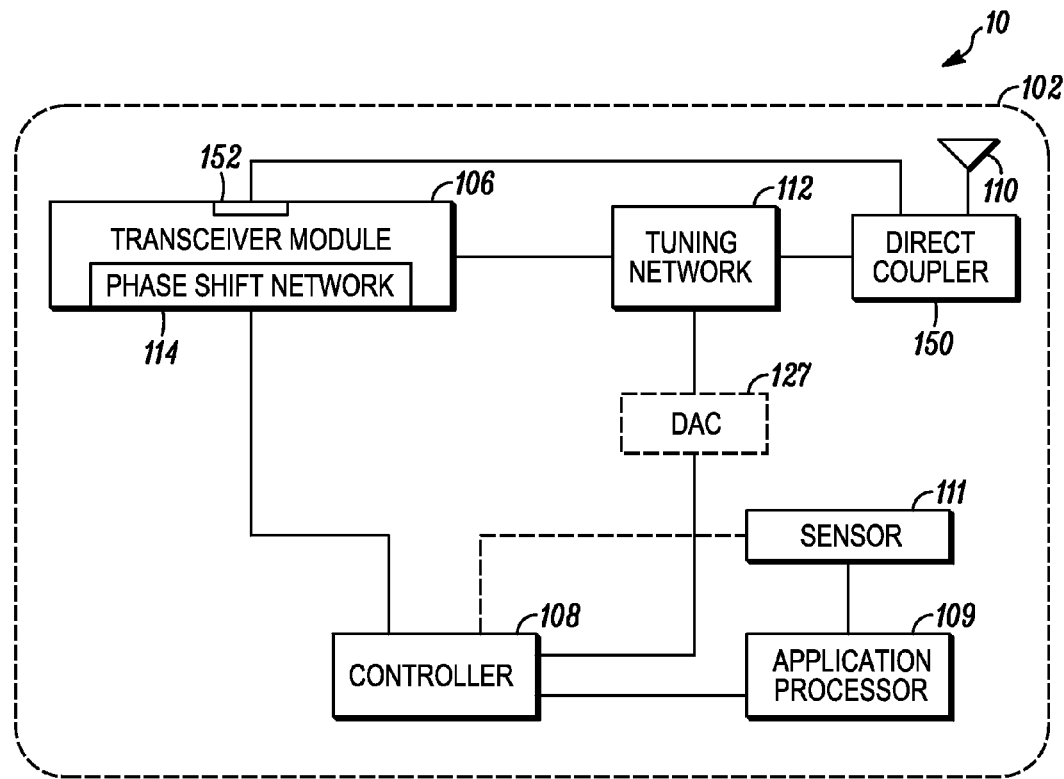
Figure 1B:
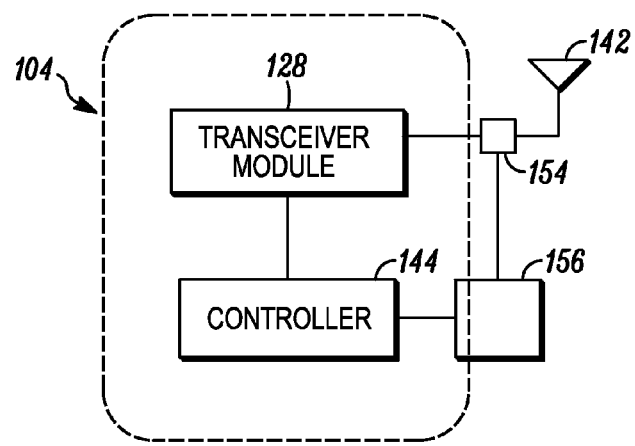

Another embodiment of the invention is shown in FIG. 1B. The above description relating FIG. 1A also applies to FIG. 1B, except that in FIG. 1B the transceiver module 106 of the communication device 102 includes the phase shift network 114. The transceiver module 106 of FIG. 1B is electrically coupled to the tuning network 112.

Although the components of FIGS. 1A and 1B are depicted as being next to one another, it is understood that there may be many intervening components that will still permit the components of FIG. 1A to be electrically coupled such that electrical signals from one component will reach the other component, either directly or through intervening components.

Figure 2A:
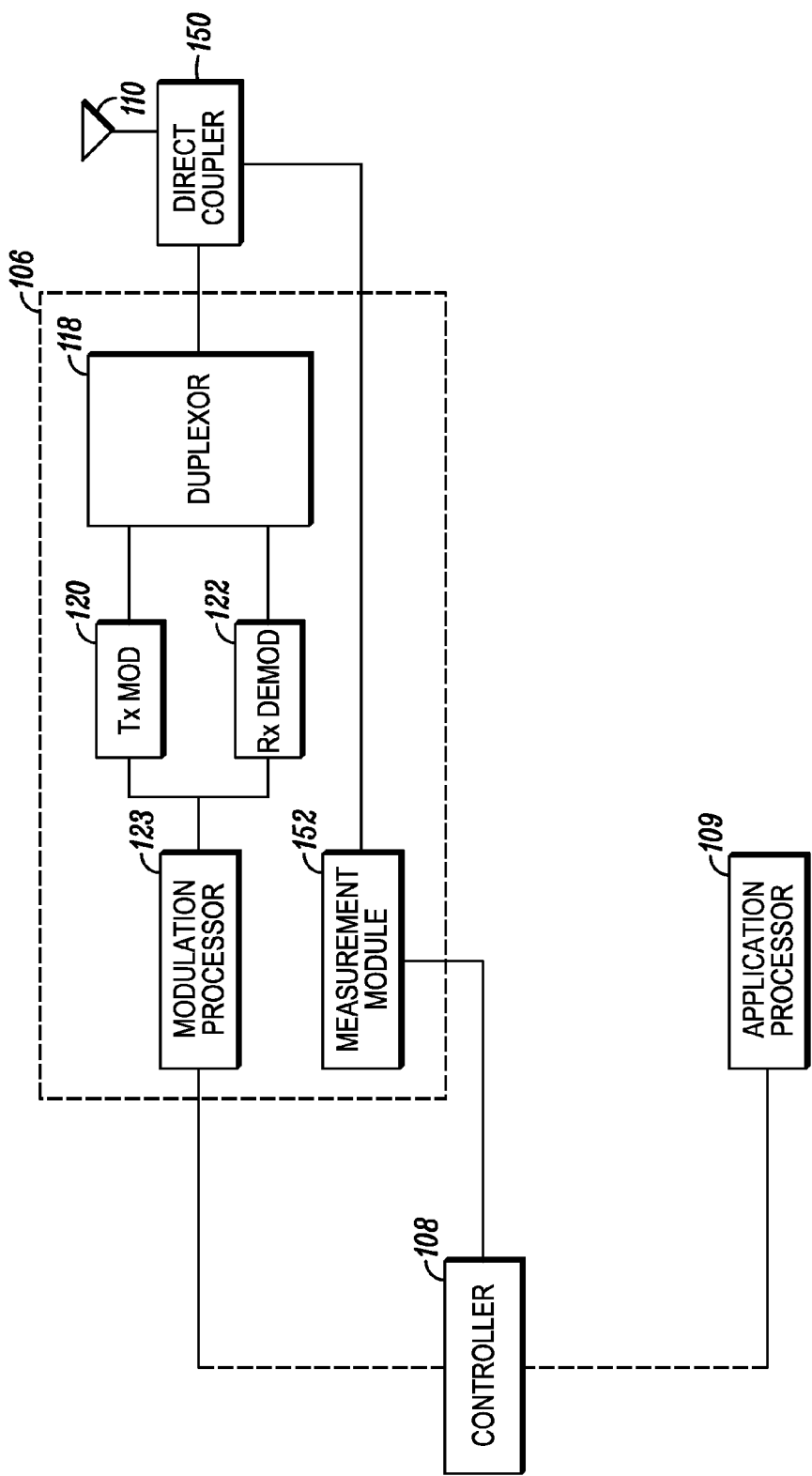
FIGS. 2A and 2B show components of a communication device according to an embodiment of the invention.

Referring to FIG. 2A, a more detailed description of the architecture of the transceiver module 106 (from FIG. 1A) according to an embodiment of the invention will now be described. The transceiver module 106 includes a duplexor 118, a transmission (Tx) modulator 120 communicatively linked to the duplexor 118, and a receiver (Rx) demodulator 122 also communicatively linked to the duplexor 118 and a modulation processor 123 communicatively linked to both the Tx modulator 120 and the Rx demodulator 122. The duplexor 118 combines and separates the signals coming from and going to the Rx demodulator 122 and the Tx modulator 120 respectively, enabling the mobile device 102 to both transmit and receive simultaneously. The modulation processor 123 also controls the band, sub-band, or channel on which the Tx modulator 120 and the Rx demodulator 122 communicate. The modulation processor 123 is communicatively linked to the controller 108. The modulation processor 123 sends data to the Tx modulator 120, which converts the data into an RF signal for transmission via the antenna 110. Conversely, the Rx demodulator 122 converts RF signals received via the antenna 110 into a data stream for processing by the modulation processor 123. Upon processing the data stream information, the modulation processor 123 transmits the data stream to the controller 108. The modulation processor 123 also sends data regarding the band, sub-band, or channel on which the mobile device 102 is communicating to the controller 108 as well as data regarding the state of the Tx modulator 120, and the state of the Rx demodulator 122 (e.g., Rx favored, Tx favored, or balanced). The application processor 109 sends information regarding the application state (e.g., the position of the communication device 102 relative to the user, an indication of which application program the application processor 109 is executing) to the controller 108. The transceiver module 106 also includes a measurement module 152, which measures properties of the RF signals being transmitted via the antenna 110, such as phase shift and return loss.

Figure 2B:
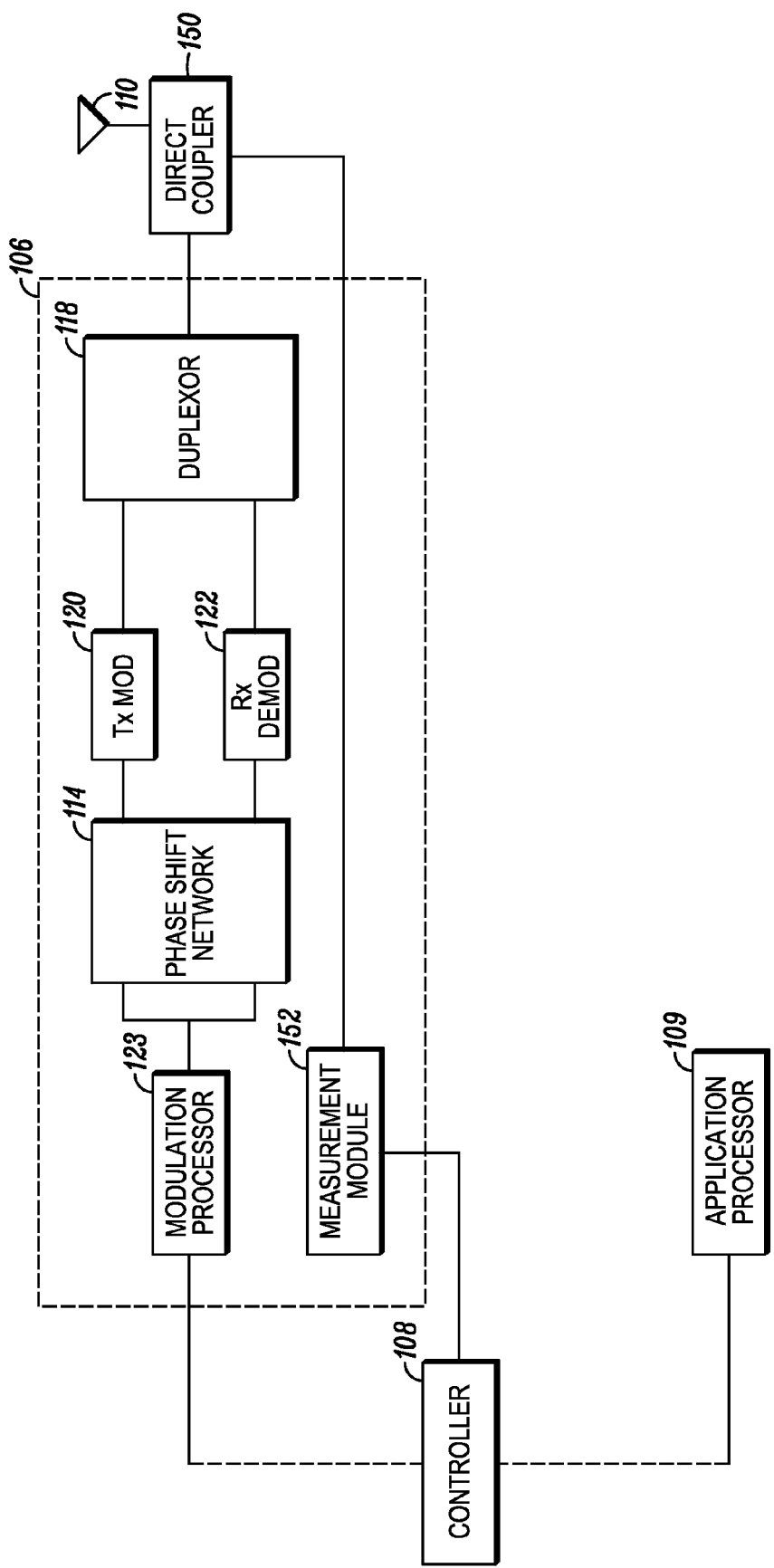

Referring to FIG. 2B, an alternate embodiment of the transceiver module 106 is shown. The functionality of the components of the transceiver module 106 of FIG. 2B are generally the same as those of FIG. 2A, except that in FIG. 2B, the phase shift network 114 is integrated within the transceiver module 106. In the embodiment of 2B, the phase shift network 114 is communicatively linked to the Tx modulator 120 and the Rx demodulator 122.

In some embodiments of the invention, the direct coupler 150 (FIGS. 1A, 1B, 2A, and 2B) provides signals directly to the Rx demodulator 122 (FIGS. 2A and 2B) and no measurement module 152 is needed. In such an embodiment, the Rx demodulator 122 would perform the functions of the measurement module 152. Having the signals sent to the Rx demodulator 122 may be useful in a Time Division Duplex (TDD) implementation of the communication device 102, whereas having the measurement module 152 may be useful in a Frequency Division Duplex (FDD) implementation.

According to an embodiment of the invention, the impedance of the tuning network 112 may be adjusted to carry out antenna matching. For example, the impedance of the tuning network 112 may be changed so that the net impedance of the tuning network 112 and the antenna 110 is 50 ohms, thereby 'matching' the impedance of transceiver 106. Referring to FIGS. 1A and 1B, the controller 108 may make this adjustment in response to a "tuning event." A tuning event is an event that may change the impedance of the antenna 110, thereby requiring a commensurate adjustment of the tuning network 112. Examples of tuning events include the user of the communication device 102 changing its position (e.g., changing the position of a cellphone from the left ear to the right ear); a change in the state of the Tx modulator 120 and/or the Rx demodulator 122; or a change in the band or sub-band over which the communication device 102 is communicating.

When the communication device 102 needs to transmit data, that data is provided to the transceiver module 106. The data is in the form of one or more baseband signals (referred to collectively as "a baseband signal"). In the embodiment depicted in FIG. 2A, the Tx modulator 120, under the control of the modulation processor 123, converts the baseband signal into radio frequency (RF) signal and provides the RF signal to the duplexor 118. The RF signal then passes to the phase shift network 114 (FIG. 1A). The phase shift network 114 may advance or retreat the phase of the RF signal by a known amount. The phase-shifted RF signal is provided to the tuning network 112. The phase of the RF signal received by the tuning network 112 may be referred to as "the input phase." The tuning network 112 changes its impedance under control of the controller 108 to carry out the antenna matching.

Alternatively, in the embodiment depicted in FIG. 2B, the baseband signal is provided to the phase shift network 114, which alters the baseband signal. An example of this alteration will be described below in conjunction with FIG. 5. The phase shift network 114 provides the altered baseband signal to the Tx modulator 120. The Tx modulator 120 converts the baseband signal to an RF signal. As a result of the processing that the phase shift network 114 performed on the baseband signal, the phase of the RF signal coming from the Tx modulator 120 will be advanced by a known amount. The phase-shifted RF signal is provided to the tuning network 112. As with the previous embodiment, the phase of the RF signal received by the tuning network 112 may be referred to as "the input phase." The tuning network 112 changes its impedance under control of the controller 108 as appropriate.

Referring again to FIGS. 1A and 1B, the tuning network 112 is operable to adjust its impedance to the complex conjugate of the antenna 110. Such adjustment helps to optimize the ability of the antenna 110 to radiate a signal that can be received by the base station 104. The radiated signal is received by the base station antenna 142, and then passes to the transceiver module 128 of the base station 104, which demodulates and recovers the original data, which then is passed to the controller 144 of the base station.

In an embodiment of the invention, the phase of the signal leaving the tuning network 112 and being radiated by the antenna 110 can be referred to as "the output phase." The difference between the output and input phases (e.g., output phase—input phase) can be referred to as "the insertion phase." The "phase shift" is the difference between the insertion phase prior to the tuning network adjustment and the insertion phase after the tuning network adjustment.

Referring to FIGS. 1A, 1B, 2A, and 2B, a description of how the communication device 102 changes the state of the tuning network 112 to tune the antenna 110 (e.g., in response to a tuning event), as well as how the communication device 102 compensates for resulting phase shift according to an embodiment of the invention will now be described. This embodiment may be referred to as an "open-loop" method with respect to the phase shift compensation. It is understood that this is a high-level description and that there may be many other steps involved in the process.

When the controller 108 adjusts the tuning network 112 (in response to a tuning event, for example) the controller 108 also adjusts the phase shift network 114. The controller 108 determines the adjustments that need to be made to the phase shift based on the state of the communication device 102. The controller may determine the state of the communication device 102 based on data received from the sensor 111. Such data may include data regarding one or more of the following characteristics of the communication device 102: (1) the band, sub-band or channel on which the communication device is communicating (received, for example, from the transceiver module 106; (2) the application for which the communication device is being used, (received, for example, from the application processor 109; (3) the state of the antenna (received, for example, from the sensor 11); and (4) the state of the Tx modulator 120 and Rx demodulator (received, for example, from the modulation processor 123 of the transceiver module 106. The controller 108 uses the received data to reference a look-up table. The look-up table contains numerical values that indicate to the controller 108 what signals to send to the tuning network 112 (to tune the antenna 110) and what signals to send to the phase shift network 114 (to compensate for the phase shift resulting from the tuning). The lookup table and the values contained therein may be stored in a memory of the controller 108. The memory of the controller 108 may also contain the current settings of the tuning network 112 and the phase shift network 114.

Based on the values obtained from the lookup table, the controller 108 transmits signals to the phase shift network 114 and to the tuning network 112. In response to the signals, the tuning network will shift the phase of the RF signal by an amount P, and the phase shift network 114 will shift the phase of the RF signal (either directly, or by altering the baseband signal) by an amount −P. Thus, the net phase shift of the signal transmitted via the antenna 110 will be −P+P=0, thereby shielding the base station 104 from a phase shift.

According to an embodiment of the invention, the controller 108 (FIGS. 1A and 1B) can account for the time it takes for the signal to propagate from the phase shift network 114 and the tuning network 112. For example, when transmitting a signal, assuming the propagation time, t, is fixed and known, the controller 108 can adjust the settings of the phase shift network 114 at a time T, and then wait to adjust the tuning network 112 for a time delay D, where the time delay equals the propagation delay from the phase shift network 114 to the tuning network 112. In receiving a signal, for example, the controller 108 can operate the antenna tuning network 112 first at a time T2, and then adjust the phase shift network 114 after a time delay D where D is the propagation time between the tuning network 112 and the phase shift network 114. In this way the signal received will show minimal phase shift from the tuning network adjustment event. Either of these techniques may minimize the phase shift caused by a change in the tuning network 112.

In another embodiment of the invention, the communication device 102 may compensate for phase shift in a closed-loop manner. In this embodiment, the antenna tuning process is the same as discussed above in the open-loop embodiment. However, to carry out the phase shift compensation, the controller 108 uses data received from the measurement module 156 (or Rx demodulator 122). This data indicates the actual phase shift or return loss being experienced at the output of the antenna 110. The controller 108 uses this data to determine how much of an offsetting phase shift is needed. For example, if the actual phase shift occurring at the antenna 110 is P, then the controller 108 may control the phase shift network 114 to shift the phase of the RF signal (either directly, or by changing the baseband signal) by an amount −P. In some embodiments, the appropriate adjustments to the phase shift network 114 may be contained in the look-up table. In other words, the look-up table may contain values that correlate the actual phase shift data to settings that the phase shift network 114 needs in order to compensate. In other embodiments, the look-up table may contain values that correlate the return loss values to settings that the phase shift network 114 needs in order to compensate.

According to an embodiment of the invention, the communication device 102 uses a closed-loop method for compensating for phase shift, as described above, and distinguishes between tuning events that occur during "protected periods"—e.g., periods of time during which a gradual phase shift is needed, such as during a transmission by or receipt of a signal by the communication device 102 and "regular periods"—e.g., periods of time during which a gradual phase shift is not needed, such as when no transmission or receipt is occurring. During regular periods, the communication device 102 tunes the antenna 110 (by, for example, adjusting the tuning network 112) at a first rate. During protected periods, the communication device tunes the antenna at a second rate. In this embodiment, the first rate is faster than the second rate. The communication device 102 may carry out antenna tuning during a regular period using one or more of the techniques previously discussed, and may carry out phase adjustment using one of the previously discussed techniques.

For protected periods, the antenna tuning and the phase compensation process may be carried out as follows. When the controller 108 determines that a tuning event has occurred during a protected period, the controller 108 wakes up the measurement module 156. The controller 108 waits for the measurement module 156 to settle (e.g., power up). Of course, if the Rx module is providing the phase shift data, then there may not be a need for a "wake up" step. The controller 108 determines how to adjust the tuning network 112 required for the tuning network 112 to reach a target impedance. This determination is made based on one or more of the techniques described above (e.g., determining characteristics of the communication device 102 and referencing the look-up table). The controller 108 also measures the pre-tuning phase shift of the signal being transmitted, as indicated by data from the measurement module 156. The controller 108 divides the required adjustments into a series of steps, with each step corresponding to an incremental adjustment of the tuning network 112. For example, if the controller 108 determines that the tuning network 112 needs to be adjusted by an amount X to reach its target impedance, it divides the adjustments into X/n, where n is the number of steps. The controller also determines the time increment for each step. The controller then adjusts the network 112 by X/n, and re-measures the actual phase shift. The controller adjusts the phase shift network 114 in a manner sufficient to compensate for the tuning network adjustment. The adjustment that needs to be made to the phase shift network by the controller may be determined using an algorithm, stored in the controller memory, which relates the measured phase shift with the adjustment required. The adjustment may additionally or alternatively be made using a look-up table stored in the controller memory, which contains inputs and outputs of the algorithm. The previously described look-up table (having the communication device characteristics) may also be used to determine the appropriate adjustment. Once the time increment has passed, the tuning process and phase measurement and phase adjustment repeats for the next increment. This entire process repeats until all n steps are completed.

Alternatively, the controller 108 may use return loss data obtained from the measurement module 156 to determine the required phase shift at each increment. In that case, the algorithm or the look-up table would relate return loss data to the tuning network adjustment.

As discussed above with respect to FIGS. 1A and 1B, measurements regarding the actual phase shift occurring at the output of the antenna 110 may also be made by the base station 104 and transmitted to the communication equipment 102. The controller 108 could use this phase shift information to carry out a closed-loop phase compensation in the same manner as if it were receiving the phase shift data from the measurement module 156 or the Rx demodulator 122.

In another embodiment of the invention, the communication device 102 may, in addition to tuning the antenna 110 and compensating for a phase shift, adjust the amplitude of the transmitted RF signal in response to a tuning event. Such an adjustment may be made by changing the settings of a power amplifier of the communication device 102.

Figure 10A:
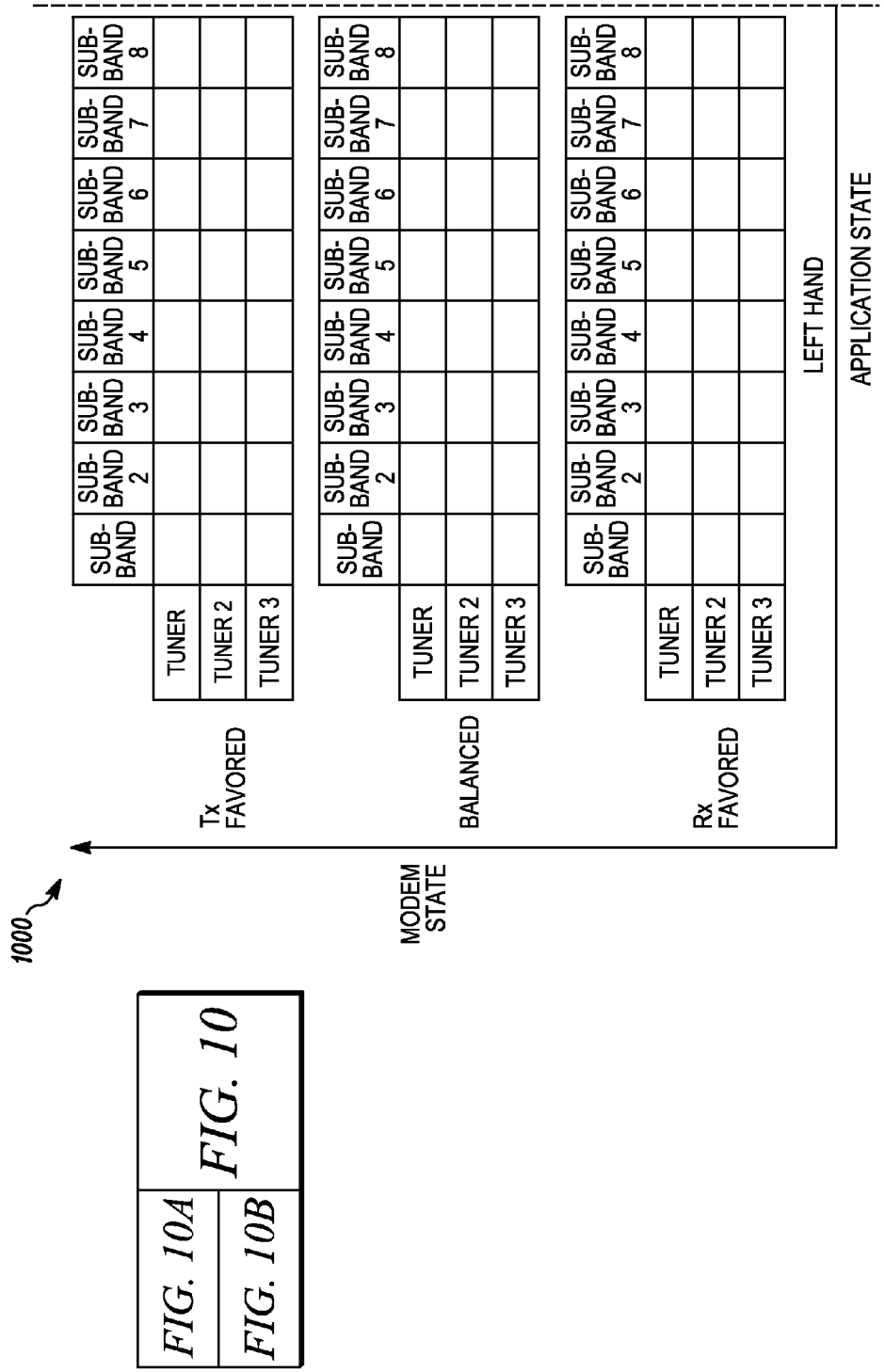
FIGS. 10A and 10B show an example of the structure of a lookup table in accordance with an embodiment of the invention.
Figure 10B:
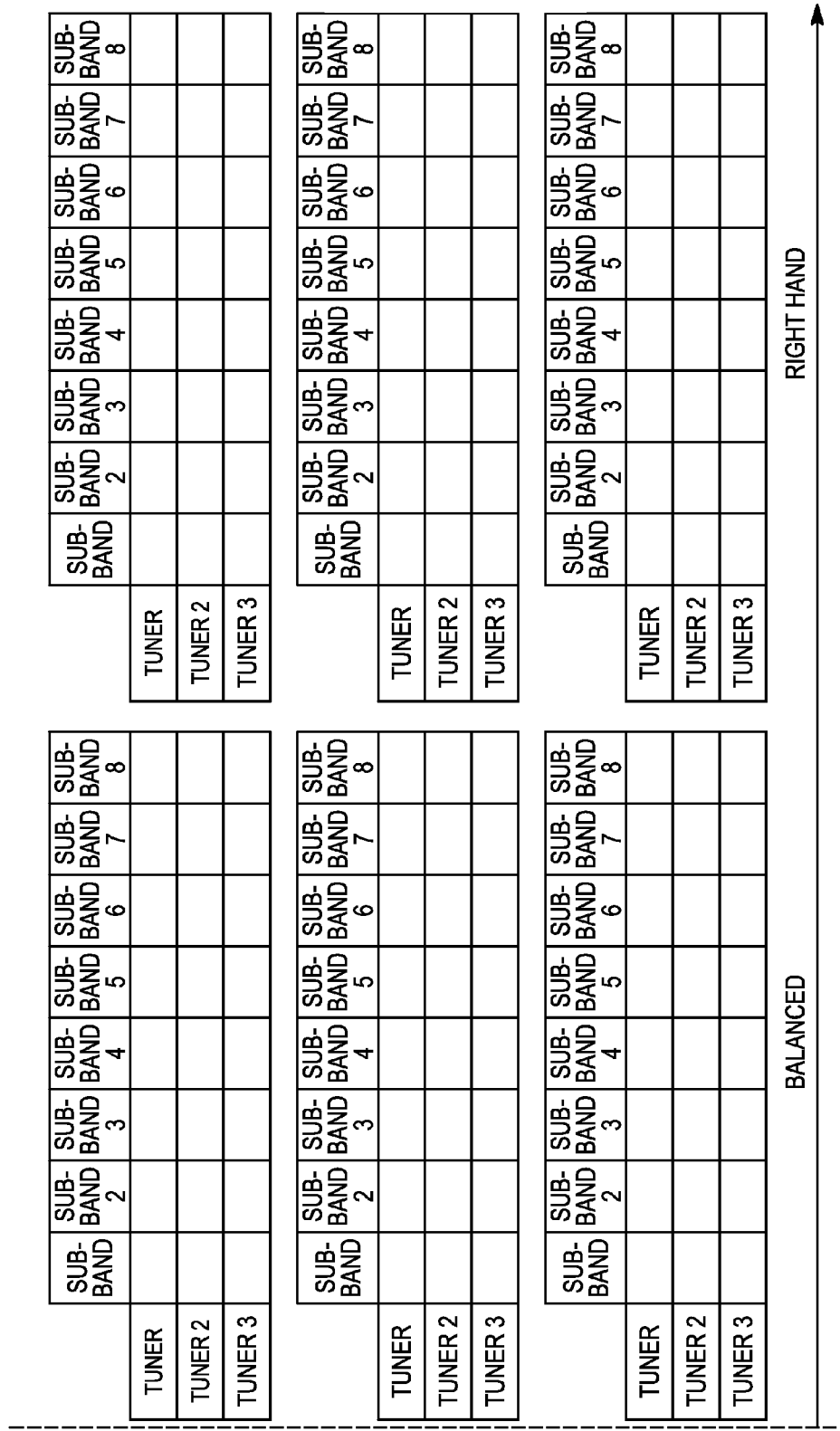

Referring to FIGS. 10A and 10B, an example of a lookup table in accordance with an embodiment of the invention will now be described. The lookup table, generally labeled 1000, may have three or more dimensions (e.g., frequency, sub-band, state of the communication device 102 (FIGS. 1A and 1B), state of the tuning network 112 and the phase shift network 114, actual measured phase shift, actual measured return loss), but is shown as a series of two-dimensional tables for the sake of clarity. The lookup table 1000 associates the sub-band on which the communication device 102 (FIGS. 1A and 1B) operates, according to one of three Tx/Rx states: Rx Favored, Balanced, or Tx Favored. If the Tx modulator 120 (FIGS. 2A and 2B) is more challenged than the Rx demodulator 122 (e.g. the Tx modulator 120 is transmitting at maximum power but the Rx demodulator is below maximum power), then the Tx modulator and Rx demodulator will be in a Tx Favored state, such that the tuning network 112 and the phase shift network 114 will need to be put into a state that minimizes the loss on the transmit frequency. If the Rx demodulator 122 is more challenged than the Tx modulator 120 (e.g. the Rx demodulator 120 is experiencing bit and/or frame errors as a result of it being set at a level that is too sensitive), then the Tx modulator and Rx demodulator will be in an Rx Favored mode, such that the tuning network 112 and the phase shift network 114 will need to be adjusted to minimize the loss on the receive frequency. If the Tx modulator 120 and the Rx demodulator 122 are equally challenged then the Tx modulator and Rx demodulator are in a Balanced state.

The lookup table 1000 also associates the tuner and sub-band of the communication device 102 with one of three application states: Left Hand Talking Position, Balanced and Right Hand Talking Position. The communication device 102 is said to be in a Left Hand Talking Position state when the user is holding the communication device 102 to his head with his left hand, and in the Right Hand Talking Position state when the user is holding it to his head with his right hand. A balanced state is when the communication device 102 is not next the user's head, but is, for example, resting on a table. The sensor 111 (FIGS. 1A and 1B) detects (using, for example, proximity sensing electronics) the application state and provides this information to the application processor 109 which, in turn, provides the information to the controller 108.

Other Tx and Rx states are possible in the lookup table 1000. For instances, the Rx may be challenged while the Tx is enjoying very low link loss. In this mode, the antenna tuner would be adjusted to improve the Rx signal, possibly even at the expense of the transmit signal. Since the Tx signal is enjoying low loss, the transmit modulation could be set to a higher order, such as 64 QAM. In this state, the base station receiver will have heightened sensitivity to phase shifts of the Tx signal. The phase shift network 114 could be operated to compensate for phase shifts of the Tx signal, while the tuning network 112 is operated to improve the quality of the Rx signal. Furthermore, other criteria to describe the communication state of the communication device 102 may be used to index the lookup table 1000 (e.g., be used as a row, column or as page labels), including the state of the antenna 110.

Figure 3:
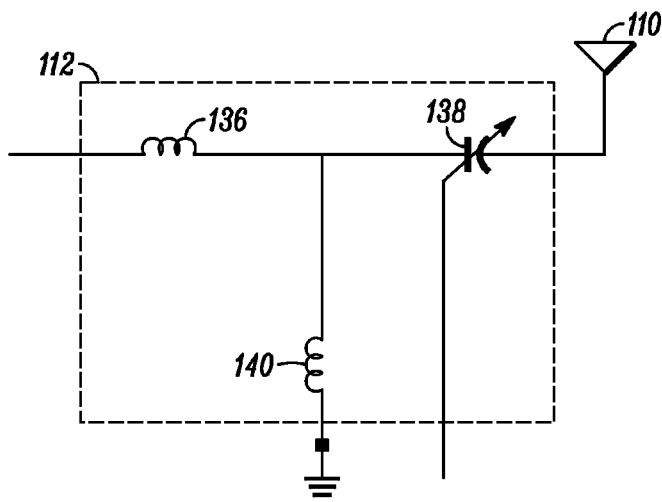
FIG. 3 shows a circuit layout of a variable tuning network according to an embodiment of the invention.

In an embodiment of the invention, the sensor 111 (FIGS. 1A and 1B) detects the state of antenna 110 directly by measuring electrical properties of the antenna 110, and provides this information to the application processor 109 which, in turn, provides the information to the controller 108. The controller 108 receives antenna 110 measurement data and uses the received data to reference a look-up table. The lookup table contains numerical values that indicate to the controller 108 what signals to send to the phase shift network 114 and to the tuning network 112. The lookup table and the values contained therein may be stored in a memory of the controller 108. Sensor 111 can detect an electrical property of the antenna 110, such as delivered power, reflected power, return loss or impedance using, for example, a directional coupler and measurement receiver. In this way, the electrical properties of the antenna 110 are measured directly to determine of the desired state of tuning network 112 and phase shift network 114, In another embodiment of the invention, the sensor 111 can feed the antenna state back to the controller 108 directly as shown in phantom in FIG. 1B Controller 108 can include a closed loop controller for controlling tuning network 112 and phase shift network 114. For example, the sensor 111 can provide complex return loss data to the controller 108, which translates the complex return loss to a corresponding value of insertion phase. The controller 108 then adjusts the phase shift network 114 to cancel any changes in insertion phase due to changes in the state of tuning network 112. For example the controller 108 can perform a translation of complex return loss to insertion phase of antenna 110 by calculating the ratio of insertion phase to return loss in an antenna equivalent, such as the circuit 800 (FIG. 8) in series with the tuning circuit 112 (FIG. 3). The phase shift network 114 is then adjusted to provide the negative of the calculated insertion phase. In this way, changes in antenna insertion phase can be cancelled in real time, to provide a constant antenna insertion phase.

Figure 11:
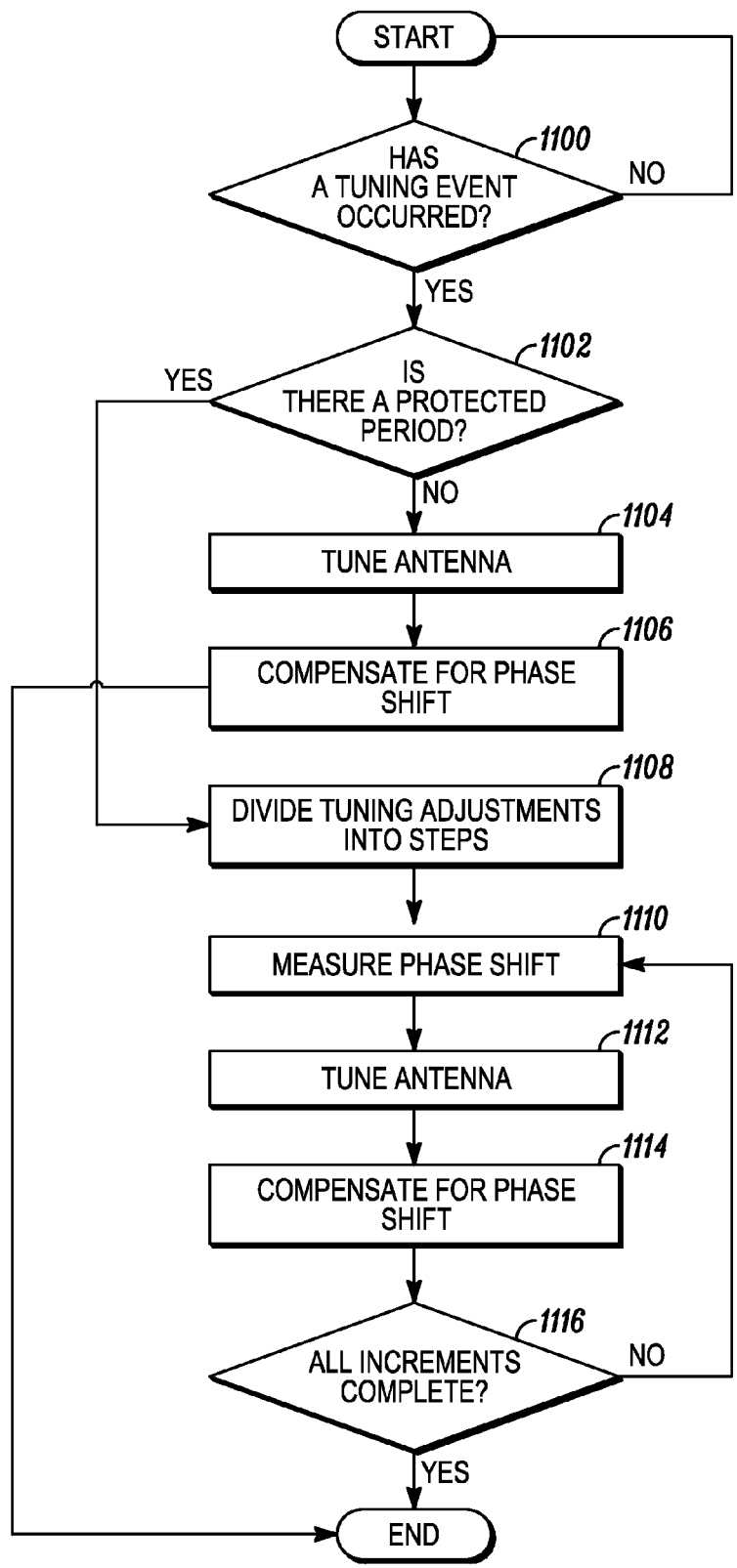
FIG. 11 shows steps that are carried out to compensate for a phase shift according to an embodiment of the invention.

Referring to FIG. 11, as well as to FIGS. 1A and 1B, an example of a procedure that is followed to compensate for phase shift according to an embodiment of the invention will now be described. At step 1100, the controller 108 determines whether a tuning event has occurred. If the controller determines that a tuning event has occurred, the process moves back to start. If the controller determines that a tuning event has occurred, then the process moves to step 1102. At step 1102, the controller determines whether the communication device 102 is currently in a protected period. If the controller determines that the communication device is not in a protected period, then the process moves to step 1104, at which the tuning network 112, under control of the controller 108, changes its impedance to tune the antenna 110. At step 1106, the phase shift network 114, under control of the controller 108, compensates for the phase shift caused by the change in impedance of the tuning network 112. The process then ends.

If, back as step 1102, the controller 108 determines that the communication device 102 is in a protected period, then the process proceeds to step 1108, at which the controller divides the required tuning adjustment into steps. The measurement module 152 measures the phase shift at the antenna 110 and provides the measurement to the controller 108 at step 1110. At step 1112, the tuning network 112, under control of the controller 108, tunes the antenna 110. controller 108. At step 1114, the phase shift network 114, under control of the controller 108, compensates for the phase shift caused by the change in impedance of the tuning network 112. If, at step 1116, all of the incremental tuning adjustments have been made, the process ends. If not, the process moves back to step 1110.

Figure 5:
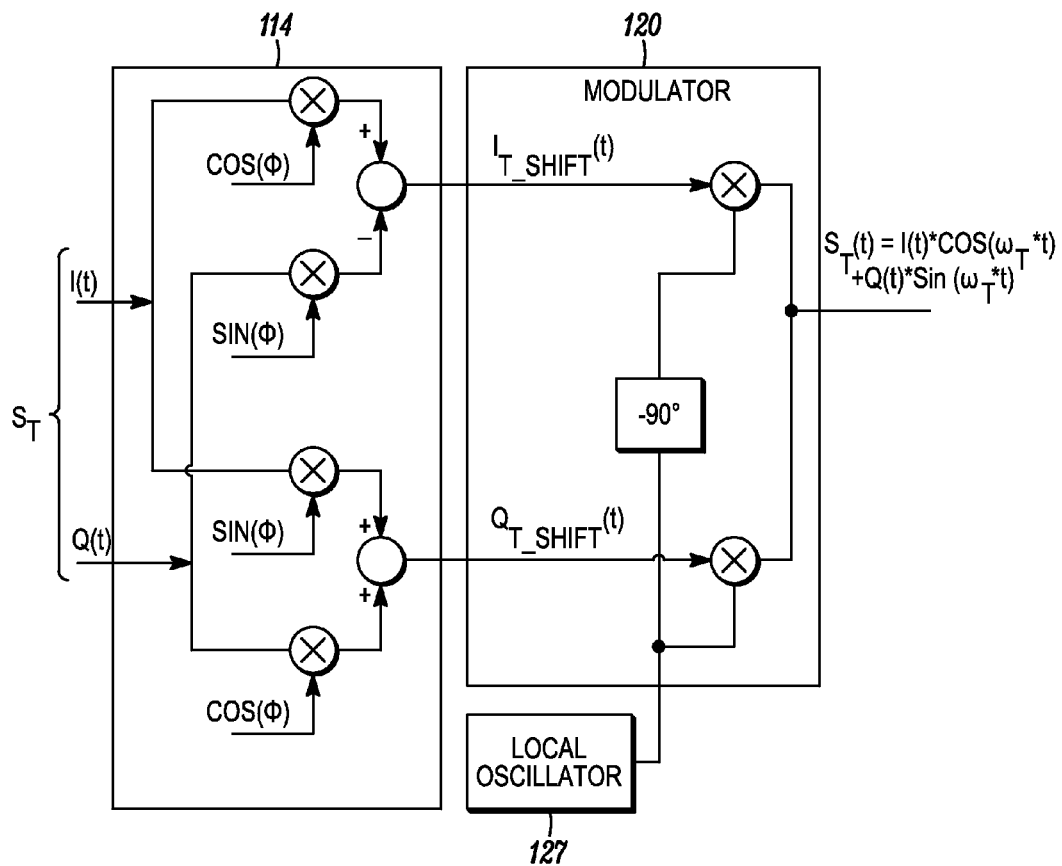
FIG. 5 shows a representation of the Tx modulator and phase shift network according to an embodiment of the invention.
Figure 6:
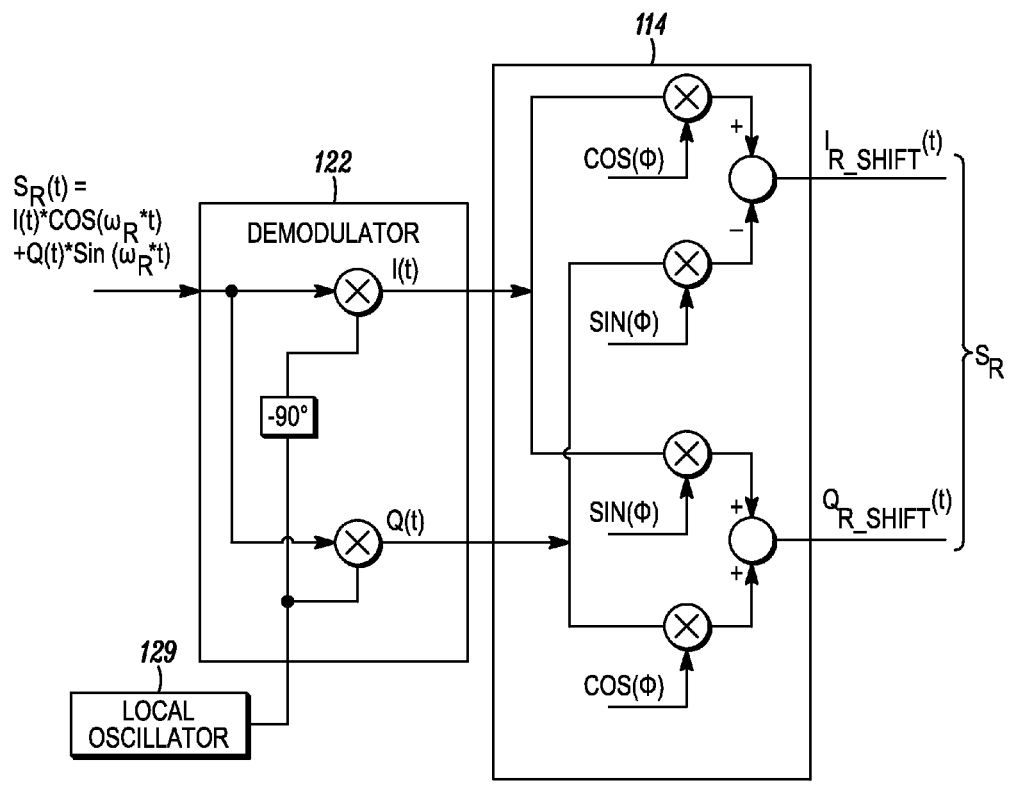
FIG. 6 shows a representation of the Rx demodulator and phase shift network according to an embodiment of the invention.

Referring to FIGS. 5 and 6, the operation of the phase shift network 114, the Tx modulator 120, and the Rx demodulator 122 according to the embodiment of the invention depicted in FIG. 2B, will now be described in more detail. The signal passing between modulation processor 123, Tx modulator 120, and Rx demodulator 122 includes the Tx and Rx signals. The Tx signal, $S_T$, which is a baseband signal, travels out of modulation processor 123 and into Tx modulator 120 via the phase shift network 114 (FIG. 5). The Rx signal, $S_R$, which is a baseband signal, travels out of Rx demodulator 122 and into modulation processor 123 via the phase shift network 114. Local oscillator 127 provides an RF carrier signal to modulator 120 having frequency $\omega_T$ (FIG. 5). Local oscillator 129 (FIG. 6) provides an RF carrier signal to demodulator 125 having frequency $\omega_R$. Thus, $S_T$ (t) and $S_R$ (t) are RF signals, having frequency $\omega_T$ and $\omega_R$ respectively.

$S_T$ and $S_R$ are complex waveforms represented by an in-phase (I) and quadrature (Q) signal. Thus the transmit signal $S_T$ is represented by in-phase transmit signal $I_T$, and quadrature transmit signal $Q_T$, and the receive signal $S_R$ is represented by in-phase receive signal $I_R$, and quadrature receive signal $Q_R$:

$$S_T = I_T + j^* Q_T$$

$$S_R = I_R + j^* Q_R$$

Similarly, the phase shifted Tx signal, $S_{T\_SHIFT}$, is represented by an in-phase (I) signal, $I_{T\_SHIFT}$, and a quadrature (Q) signal, $Q_{T\_SHIFT}$, and the phase shifter Rx signal, $S_{R\_SHIFT}$, is represented an in-phase (I) signal, $I_{R\_SHIFT}$, and a quadrature (Q) signal, $Q_{R\_SHIFT}$:

$$S_{T\_SHIFT} = I_{T\_SHIFT} + j^* Q_{T\_SHIFT}$$

$$S_{R\_SHIFT} = I_{R\_SHIFT} + j^* Q_{R\_SHIFT}$$

In an embodiment of the invention, complex arithmetic processing is employed to implement the phase shift network 114. When multiplying two complex numbers the magnitudes multiply and the phases add. Thus the phase of a complex signal is shifted by an amount of phase shift, $\phi$, by multiplying by a multiplicand with magnitude of 1 and phase φ. In complex form the multiplicand is Cos(φ)+j*Sin(φ). Thus a Tx portion of the phase shift network 114 (FIG. 5) can shift the phase of transmit signal by complex multiplication by with a multiplicand of Cos(φ)+j*Sin(φ), as follows:

$$I_{T\_SHIFT}=I_T*Cos(\phi)-Q_T*Sin(\phi)$$

$$Q_{T\_SHIFT}=I_T*Sin(\phi)+Q_T*Cos(\phi).$$

Similarly an Rx portion of the phase shift network 114 (FIG. 6) can shift the phase of receive signal by complex multiplication by with a multiplicand of Cos(φ)+j*Sin(φ), as follows:

$$I_{R\_SHIFT}=I_R*Cos(\phi)-Q_R*Sin(\phi)$$

$$Q_{R\_SHIFT}=I_R*Sin(\phi)+Q_R*Cos(\phi).$$

In practice the Tx and Rx portions of the phase shift network 114 can be accomplished on the Tx and Rx digital baseband signals using Sine and Cosine lookup tables and digital multipliers. This can be done using discrete hardware or in a microprocessor that would be integrated within the phase shift network 114.

Simpler implementations of the Tx and Rx portions of the phase shift network 114 employing fewer multiplication steps are possible. In an embodiment of the invention, a multiplicand 1+j*Tan(φ) is employed in the phase shift network 114, which results in fewer multiplications:

$$I_{SHIFT}=I-Q*Tan(\phi)$$

$$Q_{SHIFT}=I*Tan(\phi)+Q.$$

In this case a phase shift of φ is achieved, but the output magnitude is not the same as the input magnitude. In another embodiment, a coordinated rotational digital computer (CORDIC) can be employed which does not require any multipliers.

The value of phase shift φ may vary in time in order to more exactly cancel a time varying phase shift caused by the variable tuning network 112 (FIG. 1). The phase shift network 114 can also provide frequency translation. Referring to FIG. 5 and FIG. 6, the amount of phase shift is determined by the sin(φ) and cos(φ) signals If these are static signals then the phase shift network 114 just changes the phase by an amount φ. However φ can be time varying. If φ(t)=ω*t+φ₀ then the frequency is shifted by an amount ω and the phase is shifted by an amount is φ₀ In this way, phase control can be accomplished with in-phase and quadrature signals which, instead of being baseband signals, are intermediate frequency signals or RF signals.

Referring to FIG. 3, a circuit implementation of the tuning network 112 according to an embodiment of the invention will now be described. The tuning network 112 provides a complex conjugate match between the impedance of the transceiver module 106, typically 50 ohms, and the complex impedance of the antenna 110. Different antenna designs can be employed, each having particular tuning requirements. In an embodiment, a planar inverted "L" antenna (PILA) is employed. In this embodiment, the tuning network 112 includes a circuit that has a first inductive element 136, a variable capacitive element 138 electrically coupled to the first inductive element 136, and a second inductive element 140 electrically coupled to the first inductive element 136 and the variable capacitive element 138 as well as to ground. The antenna 110 is electrically coupled to each of the aforementioned elements of tuning network 112. The variable capacitive element 138 may be implemented in a variety of ways, including a switched bank of capacitors or a capacitor with variable dielectric such as barium strontium titanate (BST) or a varactor diode.

Referring back to FIGS. 1A and 1B, the communication device 102 may include a digital to analog converter (DAC) 127 that is electrically coupled to both the controller 108 and the tuning network 112. If the variable capacitive element 138 (FIG. 3) in tuning network 112 is made up of components that are switched in and out of circuit to adjust the desired response, such as a C2C network, then the DAC 127 is not required and a digital signal can be used control the tuning network 112. A C2C network is a network that has several elements including a capacitor of value C, a capacitor of value 2*C, a capacitor with value 4*C, and may include additional components. By switching in or out the different capacitors a wide variety of capacitance values may be achieved in the tuning network. If the tuning network 112 is composed of varactors, varactor-like elements, or other continuously tuning elements, then the DAC 127 will be used to convert the digital control signal in an analog control voltage.

The phase shift network 114 (FIGS. 1A, 1B, 2A, 2B) can be implemented in a variety of ways. In an embodiment, tunable lumped element filters can be employed in high pass or low pass configurations of lumped elements, wherein the operating frequency is above the high pass corner frequency, or below the low pass corner frequency. In this way the phase can be adjusted without significantly changing the amplitude. In some cases, high pass and low pass configurations will result in a phase control range that is insufficient over a large operating frequency range. In applications requiring large operating frequency ranges, a high-pass/low-pass configuration can be employed.

Figure 4:
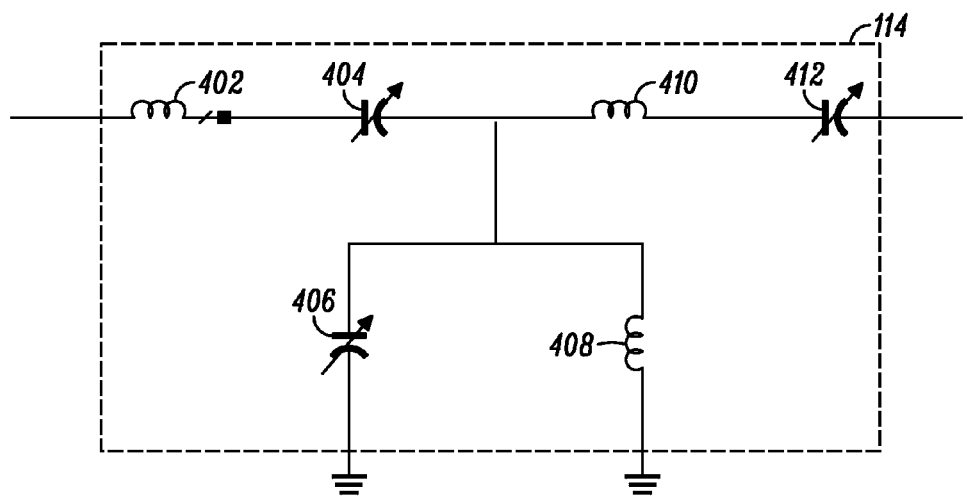
FIG. 4 shows a circuit layout of a tunable phase shift network according to an embodiment of the invention.

Referring to FIG. 4, a circuit implementation of the Tx portion and the Rx portion of the phase shift network 114 according to a high-pass/low-pass embodiment of the invention will now be described. In this embodiment, a high pass response is provided for low band operating frequencies in the range of 700 to 1000 MHz, and a low pass response is provided for high band operating frequencies in the range of 1700 to 2200 MHz. In this way a useful degree of phase control range can be provided, such as ninety degrees, at each operating frequency. In this embodiment the phase shift network 114 comprises a first inductor 402 and a first capacitor 404 which may be tunable, electrically coupled in series. The first inductor 402 and first capacitor 404 are electrically coupled to a second inductor 408 and to a second capacitor 406, which may be tunable. The second capacitor 406 is connected in shunt to ground. The second inductor 408 and the second capacitor 406 are electrically coupled to a third inductor 410 and a third capacitor 412, which may be tunable. The third inductor and third capacitor are electrically coupled in series. In an embodiment of the invention, the transceiver module (FIGS. 1A and 1B) 106 is electrically coupled to the first inductor 402 and to the first capacitor 404. The Tx modulator 120 and the Rx demodulator are electrically coupled (via the duplexor 118) to the third inductor 410 and the third capacitor 412, which are electrically coupled in series. The variable capacitive elements 404, 406 and 412 may be implemented in a variety of ways, including a switched bank of capacitors or a capacitor with variable dielectric such as barium strontium titanate (BST) or a varactor diode. In some embodiments only series capacitors 404 and 412 are tunable. In other embodiments only shunt capacitor 408 is tunable.

The phase shift network 114 (FIGS. 1A, 1B, 2A and 2B) is controlled to cancel phase shifts occurring as a result of changes made to the tuning network 112. The phase shift can be calculated by analyzing the combined transfer function of the tuning network 112 and the antenna 110. To calculate the transfer function in an embodiment of the invention, an equivalent circuit of antenna 110 is generated to match the measured impedance and to provide an analog of measured efficiency of the antenna 110. Antenna impedance and radiation efficiency can vary depending on user positions, such as free-space and hand-held positions, or talking positions in close proximity to the user's head. Different equivalent circuits of antenna 110 can be generated to match the impedance and radiated efficiency of the antenna in different user positions.

Figure 7:
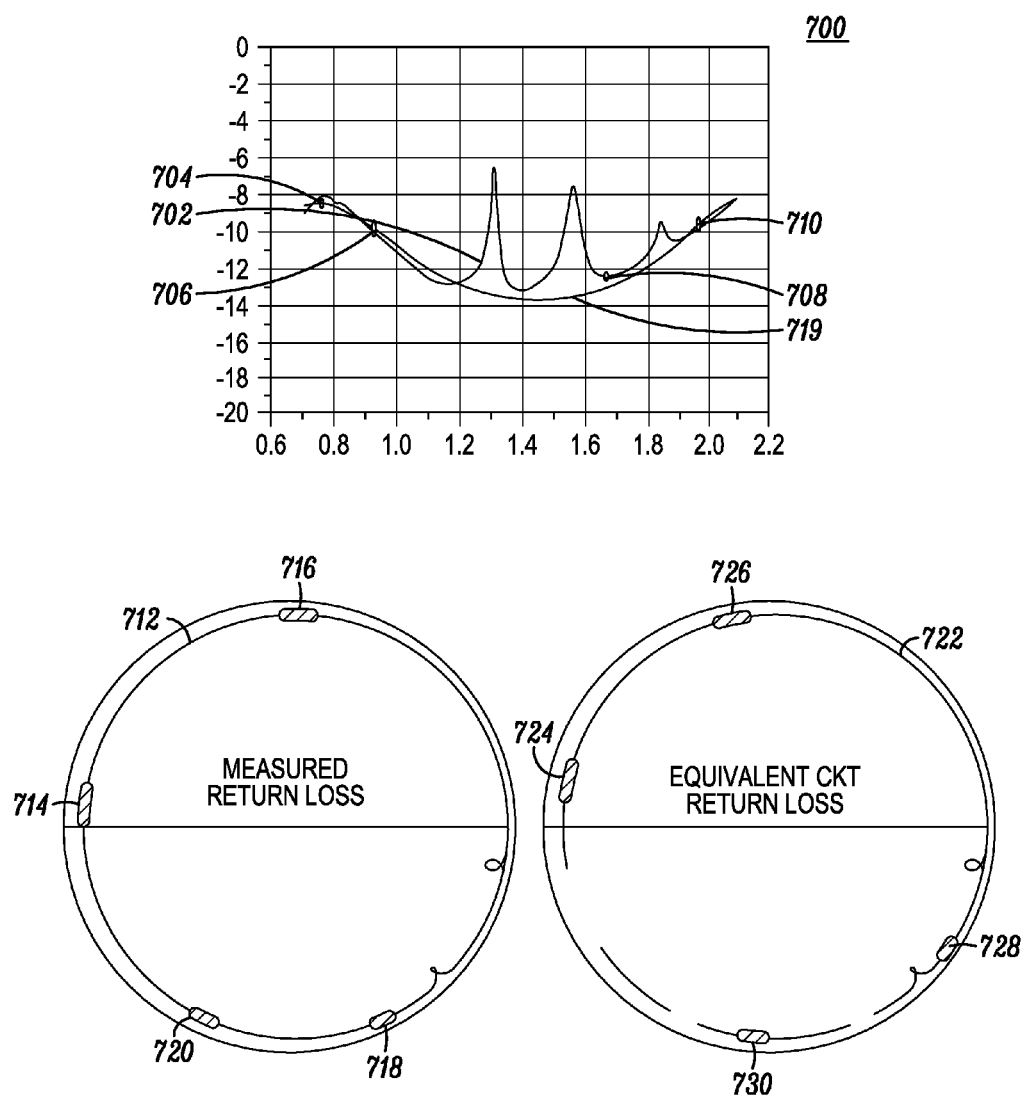
FIG. 7 shows data regarding a planar inverted L (PILA) embodiment of the antenna 110 of FIGS. 1A, 1B, 2A, and 2B.

Referring to FIG. 7, antenna data 700 is shown for a planar inverted "L" (PILA) embodiment of antenna 110. Curve 702 is the delivered power magnitude in dB units of a PILA embodiment of the antenna 110 measured in free space. Curve segments shown in bold highlight the bands of interest on the delivered power curve 702. Curve segment 704 is the delivered power in a first band of interest from 745 to 760 MHz. Curve segment 706 is the delivered power in a second band of interest from 900 to 915 MHz. Curve segment 708 is the delivered power in a third band of interest from 1710 to 1725 MHz. Curve segment 710 is the delivered power in a fourth band of interest from 1965 to 1980 MHz. Curve 712 is the PILA antenna return loss measured in free space, plotted on a Smith chart. Return loss, $\Gamma$, is related to input impedance by the relationship, $\Gamma=(Z_{ANT}-Z_{SOURCE})/(Z_{ANT}+Z_{SOURCE})$, where $Z_{ANT}$ is the impedance of the antenna 110 and $Z_{SOURCE}$ is the output impedance of the transceiver module 106, typically 50 Ohms. Curve segment 714 is the return loss in a first band of interest from 745 to 760 MHz. Curve segment 716 is the return loss in the second band of interest from 900 to 915 MHz. Curve segment 718 is the return loss in the third band of interest from 1710 to 1725 MHz. Curve segment 720 is the return loss in the fourth band of interest from 1965 to 1980 MHz.

Figure 8:
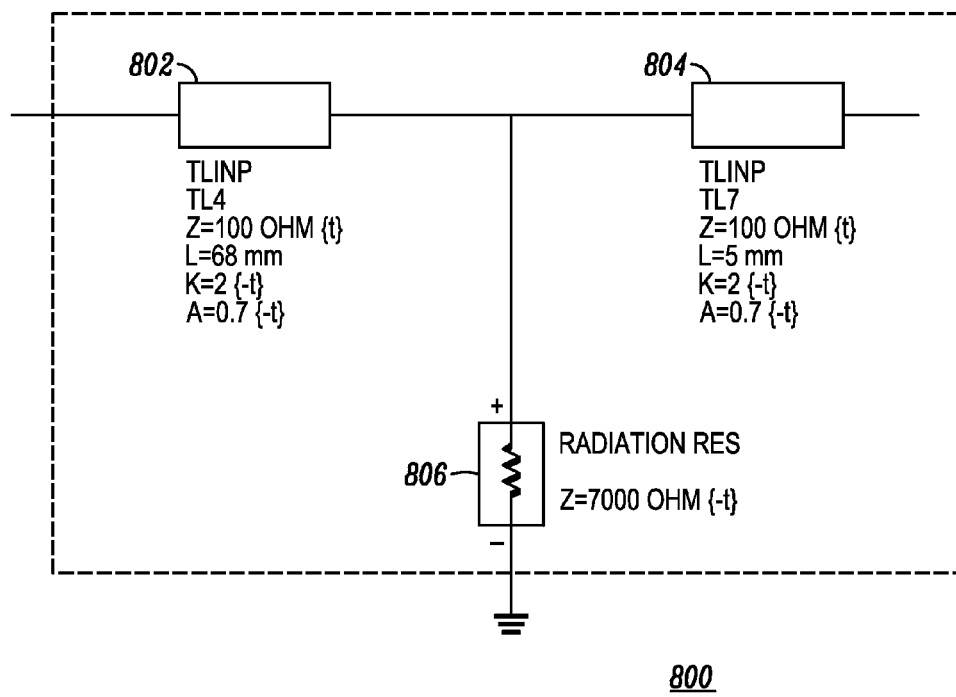
FIG. 8 shows an approximate equivalent circuit of the PILA whose data is shown in of FIG. 7.

Referring now to FIG. 8, an approximate equivalent circuit 800 of the PILA embodiment of the antenna 110 is shown. The equivalent circuit is used to approximate the phase shift of the antenna 110 and the tuning network 112 caused by changes in the tuning network 112. The phase shift is the phase of the transfer function from the output of the transceiver module 106 to the radiated signal. In the equivalent circuit, the power dissipated in a radiation resistor serves as an analog of the radiated signal power. The equivalent circuit 800 comprises a first transmission line 802, a second transmission line 804, and a radiation resistor 806. Circuit parameters, such as the value of the radiation resistor 806, and the transmission line 802 and 804 parameters, are adjusted to match the measured impedance data based on the curve segments 702 and 704 (FIG. 7) in the frequency bands of operation and a measured radiation efficiency of the PILA antenna of approximately 60%.

Referring again to FIG. 7, curve 720 shows the delivered power magnitude in dB units of the equivalent circuit of FIG. 8, where the circuit parameters are selected to match the measured delivered curve segments for the four bands of interest on delivered power curve 720. Curve segment 722 is the return loss of the equivalent circuit of FIG. 8 plotted on a Smith chart. Curve segment 724 is the return loss in a first band of interest from 745 to 760 MHz. Curve segment 726 is the return loss in the second band of interest from 900 to 915 MHz. Curve segment 728 is the return loss in the third band of interest from 1710 to 1725 MHz. Curve segment 730 is the return loss in the fourth band of interest from 1965 to 1980 MHz.

The equivalent circuit 800 (FIG. 8) can be analyzed to generate electrical data matching the measured electrical data of the PILA embodiment of the antenna 110 (FIG. 1) measured in free space, and similar equivalent circuits can be generated to match the electrical data of the antenna 110 measured in other user conditions, such as in mobile phone 'talking positions', in which the user's hand and head are proximate to the antenna near-field, and affect the measured impedance and efficiency.

Generally, antenna impedance is affected by the user's position. If the tuning network 112 (FIGS. 1A and 1B) is designed to optimally match the impedance of the antenna 110 in a first user position, it may not optimally match the impedance of the antenna 110 in a second user position. Thus the tuning network 112 can be adjusted to provide optimal matching designs for each user position. The phase shift that occurs when the tuning network 112 is changed is approximated by calculating the insertion phase through the tuning network 112 and the first transmission line 802 (FIG. 8) to the radiation resistor 806. For example, the tuning network 112 may be changed from a first state for interfacing to the antenna 110 in a free space position to a second state for interfacing to the antenna 110 in a right hand talking position. For each position, an optimum matching circuit is created by varying the tunable capacitor 138 (FIG. 3) in the tuning network 112.

Figure 9A:
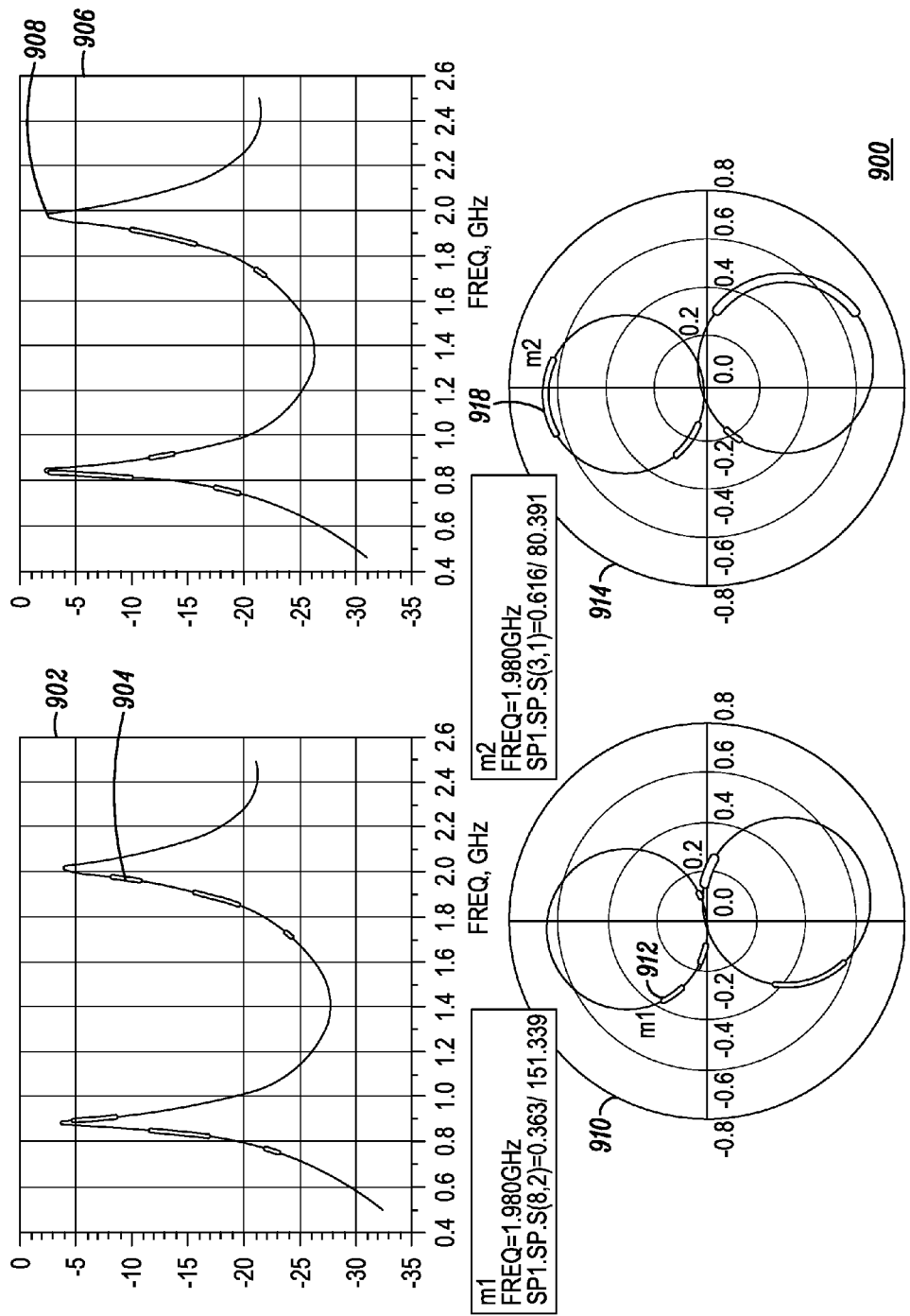
FIG. 9A shows simulation data that includes plots of transfer functions of the tuning network driving the antenna equivalent circuit of FIG. 8.

Referring to FIG. 9A, simulation data 900 is shown which includes plots of transfer functions of the tuning network 112 of FIG. 1A driving the antenna equivalent circuit 800 (FIG. 8). In this particular simulation, the equivalent circuit 800 circuit parameters are adjusted for approximating the antenna 110 performance in a 'talking' user position, and design cases for the tuning network 112 are presented. In the first design case, the tuning network 112 is designed to maximize power transfer to a antenna 110 in a free space position in the fourth band of interest, from 1965 to 1980 MHz. In the second state, the tuning network 112 is designed to maximize power transfer to the antenna 110 in a user talking position in the fourth band of interest.

Referring again to FIG. 9A, simulation data 900 is used to determine the change in insertion phase of the tuning network 112 (FIG. 1A) driving the antenna equivalent circuit 800 (FIG. 8). Graph 902 shows the amplitude response from tuning network 112 designed to maximize power delivered to the antenna 110 in the free space condition, to the radiation resistor 806 of the PILA antenna equivalent circuit 800 in the talking position. The graph 902 amplitude response is an approximation of the antenna efficiency versus frequency for an antenna in the talking position, while the tuning network 112 is optimized for free space. Because the tuning network 112 is controlled to deliver maximum power into the antenna 110 in free space, while the antenna equivalent circuit 800 is selected to match the antenna performance in the user position, the antenna efficiency is degraded to −10 dB as indicated by curve segment 904 of the band of interest, 1965 to 1980 MHz, shown in bold. Graph 906 shows the amplitude response from the tuning network 112 designed to maximize power delivered to the antenna 110 in the talking position, wherein the user's head and right hand are located in the antenna near field, to the radiation resistor 806 of the PILA antenna equivalent circuit 800 in the talking position. The graph 906 amplitude response is an approximation of the antenna efficiency versus frequency of the antenna in talking position while the tuning network is optimized for the talking position. Because the tuning network 112 is controlled to deliver maximum power into the antenna 110 in the talking position and the antenna equivalent circuit 800 is selected to match the antenna performance in the talking position, the antenna efficiency is improved to −4 dB, as indicated by curve segment 908 of the band of interest, 1965 to 1980 MHz, shown in bold. Thus, changing the tuning network 112 from a free space optimized design to a user position optimized design causes the antenna efficiency to change from −10 dB to −4 dB, for a 6 dB improvement.

Referring to FIG. 9A, the phase shift network 114 can be designed to cancel the change in insertion phase that occurs the changing the impedance of the tuning network 112 from a first state to a second state. Graphs 910 and 914 approximate antenna efficiency in polar form, from which the insertion phase of the tuning network 112 and the antenna 110 can be determined. Graph 910 shows the polar form response from the tuning network 112 designed to maximize power delivered to the radiation resistor 806 of the PILA antenna equivalent circuit 800 in the talking position. The graph 910 shows that the insertion phase is approximately 150 degrees, as indicated by curve segment 912 of the band of interest, 1965 to 1980 MHz, shown in bold. Graph 914 shows the polar response from tuning network 112 designed to maximize power delivered to the radiation resistor 806 of the PILA antenna equivalent circuit 800 (FIG. 8) in the talking position. The graph 914 shows the insertion phase is approximately 80 degrees, as indicated by curve segment 918 of the band of interest, 1965 to 1980 MHz, shown in bold. By taking the difference from graphs 910 and 914, it can be determined that the change in insertion phase is −70 degrees. Thus, a change of approximately 70 degrees in the phase shift network 114 (FIG. 1A) cancels the change in insertion phase of the tuning network 112 and the antenna 110.

Figure 9B:
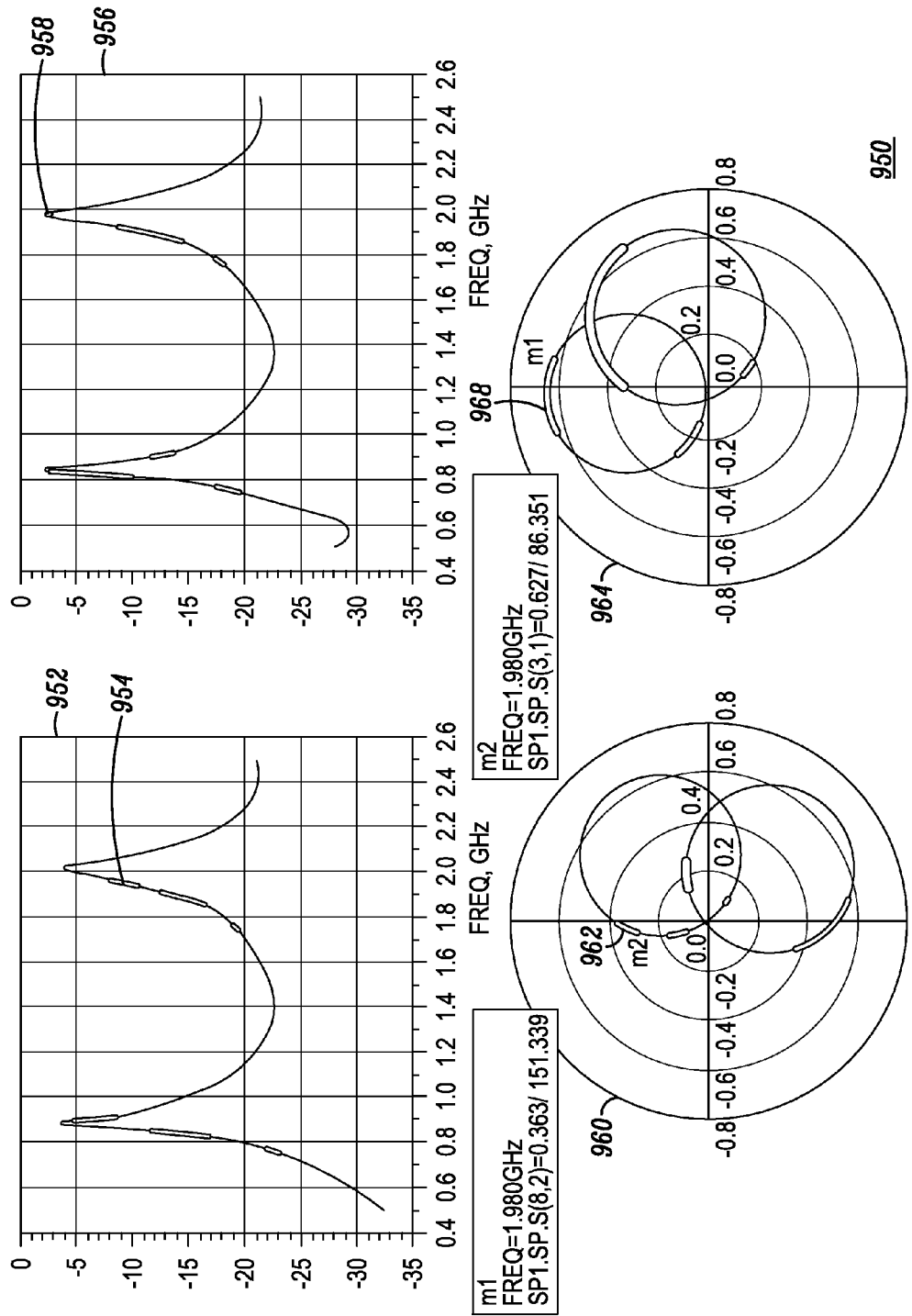
FIG. 9B shows simulation data that includes plots of the transfer function of the phase shift network and the tuning network driving the equivalent circuit of FIG. 8.

Referring to FIG. 9B, simulation data 950 is shown that includes plots of transfer functions of the phase shift network 114 and the tuning network 112 driving the antenna equivalent circuit 800 (FIG. 8). The conditions and parameters used to create simulation data 950 are the same as those used to create simulation data 900, except that a phase shift network 114 was included in series, at the input of the tuning network 112 (as shown, for example, in FIG. 1A).

Simulation data 950 is used to verify the change in insertion phase of the tuning network 112 driving the antenna equivalent circuit 800 is cancelled by an opposite phase change of the phase shift network 114. Graph 952 shows the amplitude response from tuning network 112 designed to maximize power delivered to the antenna 110 in the free space condition, to the radiation resistor 806 of the PILA antenna equivalent circuit 800 in the talking position. The graph 952 amplitude response is an approximation of the antenna efficiency versus frequency for an antenna in the talking position, while the tuning network 112 is optimized for free space. Because the tuning network 112 is controlled to deliver maximum power into the antenna in free space, while the antenna equivalent circuit is selected to match the antenna performance in the user position, the antenna efficiency is degraded to −10 dB as indicated by curve segment 954 of the band of interest, 1965 to 1980 MHz, shown in bold. Graph 956 shows the amplitude response from the tuning network 112 designed to maximize power delivered to the antenna 110 in the talking position, wherein the user's head and right hand are located in the antenna near field, to the radiation resistor 806 of the PILA antenna equivalent circuit 800 in the talking position. The graph 956 amplitude response is an approximation of the antenna efficiency versus frequency of the antenna 110 in talking position while the tuning network 112 is optimized for the talking position. Because the tuning network is controlled to deliver maximum power into the antenna in talking position and the antenna equivalent circuit is selected to match the antenna performance in the talking position, the antenna efficiency is improved to −4 dB, as indicated by curve segment 808 of the band of interest, 1965 to 1980 MHz, shown in bold. Thus, changing the tuning network from a free space optimized design to a user position optimized design causes the antenna efficiency to change from −10 dB to −4 dB, for a 6 dB improvement.

The simulation data 950 of FIG. 9B is used to verify that the change in insertion phase that occurs when changing the tuning circuit 112 from a first state to a second state is cancelled by the tuning network 114. Graphs 960 and 964 approximate antenna efficiency in polar form, from which we can determine the insertion phase of the tuning network 112 and the antenna 110. Graph 960 shows the polar form response from tuning network 112 designed to maximize power delivered to the radiation resistor 806 of the PILA antenna equivalent circuit 800 (FIG. 8) in the talking position. The graph 960 shows the insertion phase is approximately 90 degrees, as indicated by curve segment 812 of the band of interest, 1965 to 1980 MHz, shown in bold. Graph 964 shows the polar response from the tuning network 112 designed to maximize power to the radiation resistor 806 of the PILA antenna equivalent circuit 800 in the talking position. The graph 964 shows the insertion phase is approximately 90 degrees, as indicated by curve segment 968 of the band of interest, 1965 to 1980 MHz, shown in bold. By taking the difference from graphs 960 and 964, the change in insertion phase can be seen to be approximately zero. Thus, the change of +70 degrees required in data set 700 has been achieved in data set 950, by the insertion of the phase shift network 114, demonstrating that the phase shift network 114 can cancel the change in insertion phase of the tuning network 112 and the antenna 110.

Although a single phase shift network has been referred to herein, multiple phase shift networks may be used. For example, two phase shift networks may be employed, where the first phase shift network is placed in the transmitter branch affecting the transmission signal but having minimal or no impact on the receive signal. The second phase shift network may be placed in the receiver branch affecting the phase of the receive signal but having minimal or no impact on the transmit signal. By this method both the transmission and receive signals may be compensated for phase changes such as changes from gripping the phone differently, or changes from operation of the antenna tuning network. Devices with multiple transmitters or receivers may have multiple phase shift networks.

Although described specifically throughout the entirety of the instant disclosure, representative examples have utility over a wide range of applications, and the above discussion is not intended and should not be construed to be limiting. The terms, descriptions and figures used herein are set forth by way of illustration only and are not meant as limitations. Those skilled in the art recognize that many variations are possible within the spirit and scope of the examples. While the examples have been described with reference to examples, those skilled in the art are able to make various modifications to the described examples without departing from the scope of the examples as described in the following claims, and their equivalents.

What is claimed is:

1. A method for compensating for a phase shift on a communication device, the communication device comprising an antenna, the method comprising:

tuning the antenna based on a characteristic of the communication device, thereby causing a phase shift of a signal that is to be transmitted via the antenna, wherein during a transmission or receipt of a signal by the communication device, tuning the antenna is performed at a first rate, and wherein when no transmission or receipt of a signal is occurring by the communication device, tuning the antenna is performed at a second rate, wherein the first rate is faster than the second rate;

measuring a property of the signal at the antenna after the phase shift; and compensating for the phase shift based on the measured property.

2. The method of claim 1, wherein the characteristic of the communication device is chosen from a group consisting of the band, sub-band or channel on which the communication device is communicating, the application for which the communication device is being used, the state of the antenna, and the state of a transmission modulator and a receive demodulator of the communication device.

3. The method of claim 2, wherein the application for which the communication device is being used is chosen from a group consisting of a user having the device in a right hand talking position, a user having the device in a left hand talking position, and the communication device being in a balanced position.

4. The method of claim 2, wherein the state of the antenna comprises one or more of delivered power of the antenna, reflected power of the antenna, return loss of the antenna, and impedance of the antenna.

5. The method of claim 2, wherein the state of the transmission modulator and the receive demodulator is chosen from a group consisting of transmission modulator favored, receive demodulator favored, and the transceiver modulator and receive demodulator being balanced.

6. The method of claim 1, wherein the measured property of the signal is one or more of a phase shift of the signal and the return loss of the signal.

7. The method of claim 1, wherein tuning the antenna comprises:

referencing a look-up table that correlates the communication device characteristic with settings of a tuning network; and adjusting a tuning network based on the settings.

8. The method of claim 1, further comprising:

determining a total tuning required;

dividing the total tuning into increments;

repeating the tuning, measuring, and compensating steps for each increment until the total tuning has been achieved.

9. The method of claim 1, wherein tuning the antenna comprises:

incrementally adjusting a tuning network over a predetermined period of time until a target impedance of the tuning network is reached;

incrementally adjusting a phase shift network to compensate for the phase shift caused by each incremental adjustment of the tuning network.

10. A method for tuning an antenna on a communication device, the method comprising:

detecting an antenna tuning event;

determining whether the tuning event occurred during a protected period;

in response to determining that the tuning event occurred during a protected period, tuning the antenna at a first rate; and in response to determining that the tuning event did not occur during a protected period, tuning the antenna at a second rate, wherein the first rate is faster than the second rate.

11. The method of claim 10, wherein the protected period is a period during which the communication device is transmitting.

12. The method of claim 10, wherein the protected period is a period during which the communication device is receiving.

13. The method of claim 10, wherein the antenna is tuned based on a characteristic of the communication device, thereby causing a phase shift of a signal that is to be transmitted via the antenna, the method further comprising:

measuring a property of a signal at the antenna after the phase shift; and compensating for the phase shift based on the measured property.

14. The method of claim 10, wherein tuning the antenna at the first rate comprises:

incrementally adjusting a tuning network over a predetermined period of time until a target impedance of the tuning network is reached; and incrementally adjusting a phase shift network to compensate for the phase shift caused by each incremental adjustment of the tuning network.

15. The method of claim 10, wherein the antenna is tuned based on a characteristic of the communication device, wherein the characteristic of the communication device is chosen from a group consisting of the band, sub-band or channel on which the communication device is communicating, the application for which the communication device is being used, the state of the antenna, and the state of a transmission modulator and receive demodulator of the communication device.

16. An apparatus for compensating for a phase shift on a communication device, the communication device comprising an antenna, the apparatus comprising:

an antenna;

a tuning network;

a controller, wherein the controller controls the tuning network to tune the antenna based on a characteristic of the communication device, thereby causing a phase shift of a signal that is to be transmitted via the antenna, wherein during a transmission or receipt of a signal by the communication device, tuning the antenna is performed at a first rate, and wherein when no transmission or receipt of a signal is occurring by the communication device, tuning the antenna is performed at a second rate, wherein the first rate is faster than the second rate;

a sensor that measures a property of the signal at the antenna after the phase shift; and a phase shift network that, under control of the controller, compensates for the phase shift based on the measured property.

17. The apparatus of claim 16, wherein the characteristic of the communication device is chosen from a group consisting of the band, sub-band or channel on which the communication device is communicating, the application for which the communication device is being used, the state of the antenna, and the state of a transmission modulator and a receive demodulator of the communication device.

18. The apparatus of claim 16, wherein the state of the transmission modulator and the receive demodulator is chosen from a group consisting of transmission modulator favored, receive demodulator favored, and the transceiver modulator and receive demodulator being balanced.

19. A method for tuning an antenna on a communication device, the method comprising:
- a controller that determines whether a antenna tuning event has taken place, and whether the tuning event occurred during a protected period; and
- a tuning network;
- wherein, in response to determining that the tuning event has taken place during a protected period, the controller controls the tuning network to tune the antenna at a first rate,
- wherein, in response to determining that the tuning event did not take place during a protected period, the controller controls the tuning network to tune the antenna at a second rate, and
- wherein the first rate is faster than the second rate.

20. The method of claim 19, further comprising a phase shift network, wherein the controller tuning the antenna at the first rate comprises:
- incrementally adjusting the tuning network over a predetermined period of time until a target impedance of the tuning network is reached; and
- incrementally adjusting the phase shift network to compensate for the phase shift caused by each incremental adjustment of the tuning network.

* * * * *